(12) United States Patent
Agrawal

(10) Patent No.: US 6,185,140 B1
(45) Date of Patent: Feb. 6, 2001

(54) SENSING ARCHITECTURE WITH DECREASED PRECHARGE VOLTAGE LEVELS

(75) Inventor: Ghasi Agrawal, San Jose, CA (US)

(73) Assignee: LSI Logic Corporation, Milpitas, CA (US)

(*) Notice: Under 35 U.S.C. 154(b), the term of this patent shall be extended for 0 days.

(21) Appl. No.: 09/427,200

(22) Filed: Oct. 25, 1999

(51) Int. Cl.[7] .................................................. G11C 7/00
(52) U.S. Cl. ...................... 365/203; 365/208; 365/230.06
(58) Field of Search ................................. 365/203, 208, 365/230.06

(56) References Cited

U.S. PATENT DOCUMENTS 6,023,436 * 2/2000 Han ........................................ 365/203
6,026,035 * 2/2000 Kim ........................................ 365/190

* cited by examiner

Primary Examiner—David Nelms
Assistant Examiner—Connie C. Yoha

(57) ABSTRACT

According to the present invention, bitlines may be precharged to the supply voltage ($V_{dd}$) less a multiple of the transistor threshold voltage ($V_{tn}$), where the multiple is greater than or equal to 2. By precharging to a lower voltage, power consumption is reduced and memory speed is increased.

1 Claim, 2 Drawing Sheets

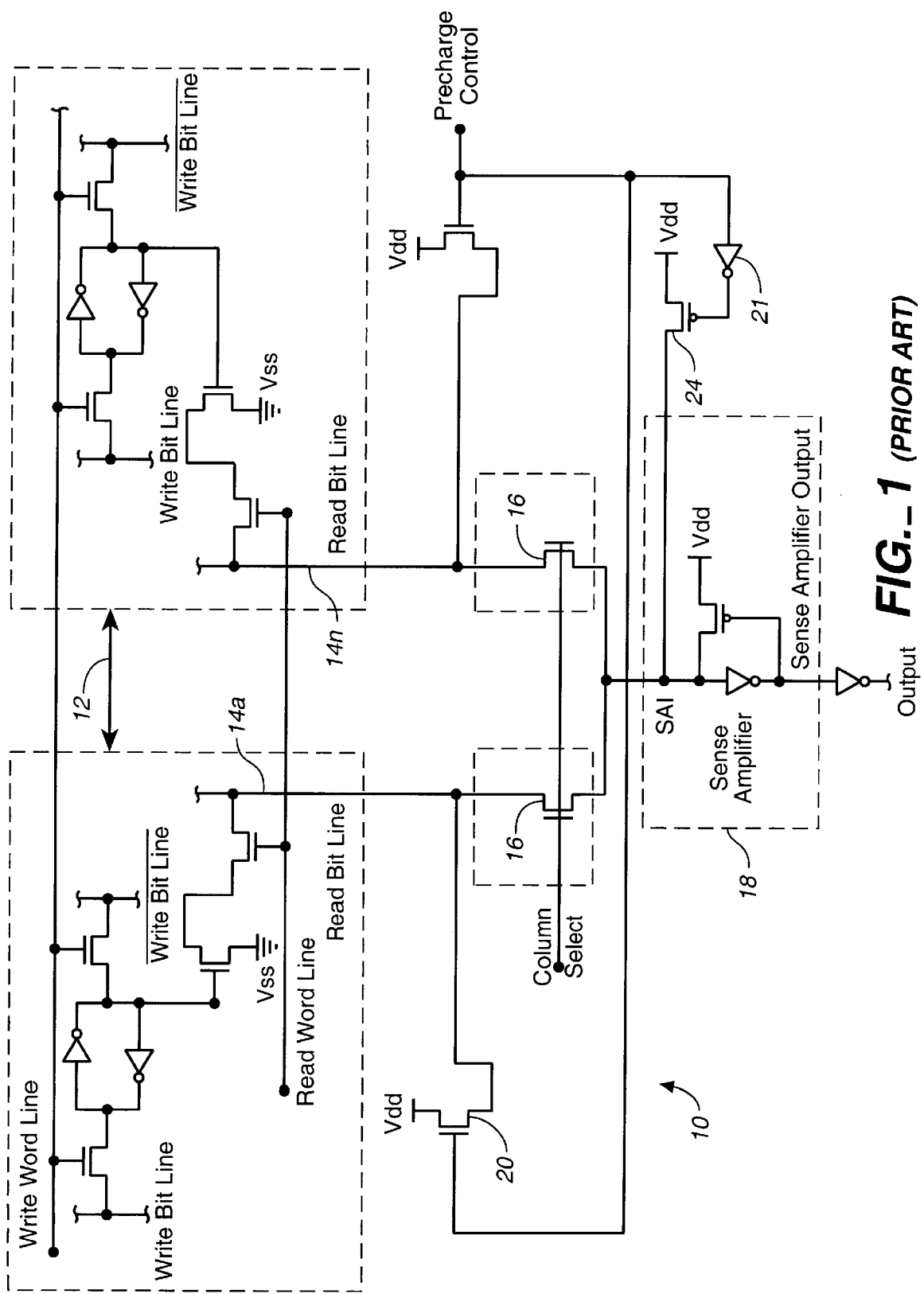
FIG._1 (PRIOR ART)

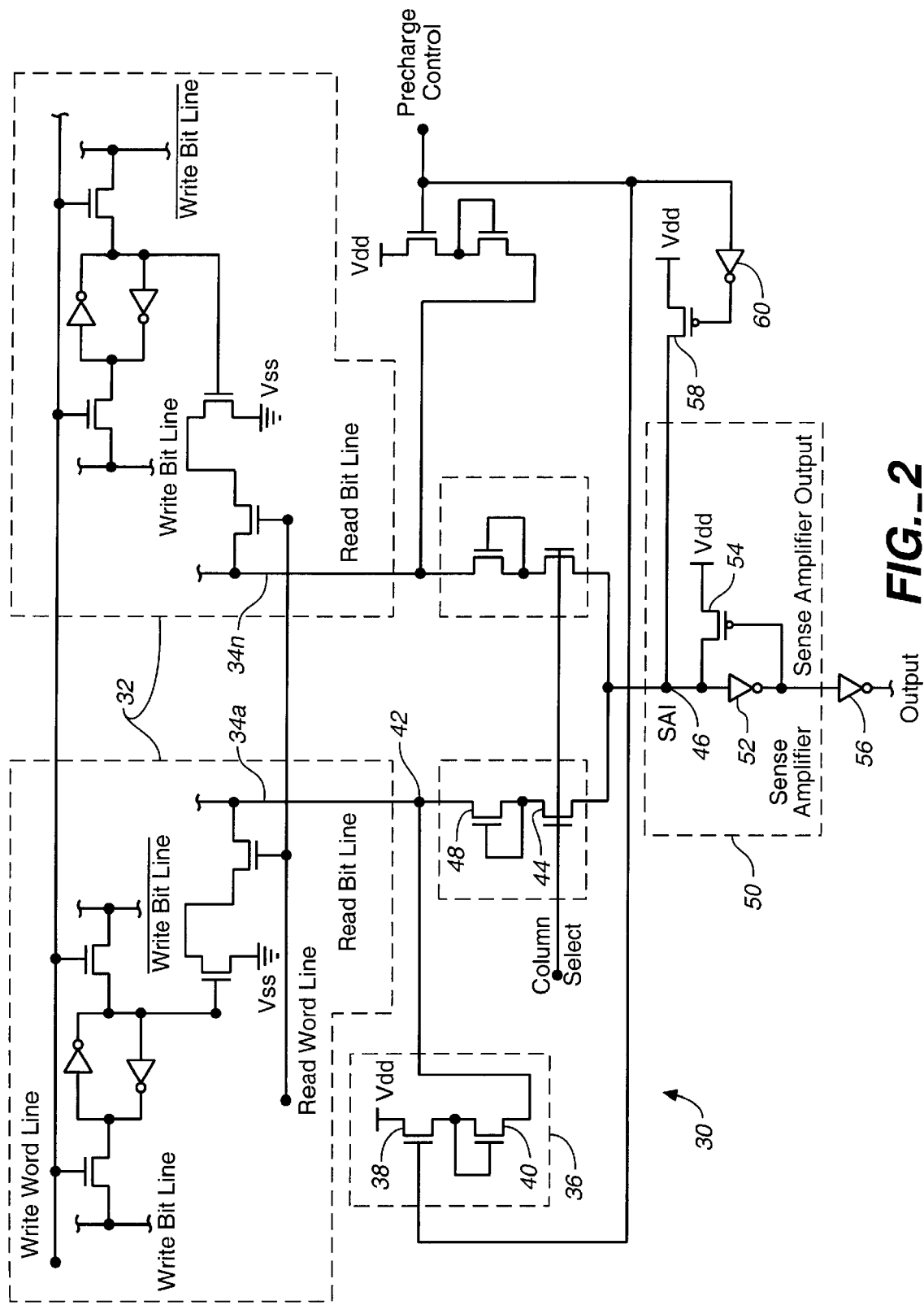
FIG._2

US 6,185,140 B1

SENSING ARCHITECTURE WITH DECREASED PRECHARGE VOLTAGE LEVELS

BACKGROUND OF THE INVENTION

1. Field of the Invention

This invention relates to digital memories and more particularly to methods and apparatus for reading data from a digital memory.

2. Description of the Related Art

FIG. 1 is a circuit diagram of a prior art digital memory sensing architecture. As shown, a memory 10 comprises a plurality of memory cells 12 in a row by column format. Each of a plurality of read bitlines 14 (where there is one read bitline per column) is coupled to a column multiplexer 16 which selects a desired bitline and provides it to a sense amplifier 18, which senses the value of the bitline (1 or 0) and provides the corresponding output. In a memory implemented with MOS technology, before a read is initiated, the bitlines 14 are precharged to a supply voltage less the threshold voltage $V_{tn}$ of a MOS transistor. Also, the input to the sense amplifier 18 is precharged to the supply voltage.

Each of the bit lines 14 such as bit line 14a has an associated n-type precharge transistor 20, that receives a precharge signal. The precharge signal turns on the precharge transistor 20, thus bringing the bit line 14a to the supply voltage ($V_{dd}$) less the transistor threshold voltage ($V_{tn}$).

A sense amplifier precharge circuit comprises a p-channel transistor 24 whose gate is coupled to the output of an invertor 21. The sense amplifier precharge circuit serves to precharge the sense amplifier input node to $V_{dd}$. In particular, the invertor 21 receives the precharge signal at its input and thus provides a low output when the precharge signal goes high. Thus, when the output of the invertor 21 goes low, the p-channel 24 pulls up the sense amplifier input node to $V_{dd}$.

It would be desirable to have a sensing architecture that has faster read access but less power consumption than the circuit shown in FIG. 1.

SUMMARY OF THE INVENTION

According to the present invention, bitlines may be precharged to the supply voltage ($V_{dd}$) less a multiple of the transistor threshold voltage ($V_{tn}$), where the multiple is greater than or equal to 2. By precharging to a lower voltage, power consumption is reduced and memory speed is increased.

According to an embodiment of the present invention, the above described precharge scheme is implemented with a circuit that comprises a plurality of read bitlines, a bitline precharge circuit, a column select circuit and a sense amplifier precharge circuit. A bitline precharge circuit establishes the precharge voltage at a first node on a first one of the plurality of bitlines. The bitline precharge circuit comprises a first n-type transistor with a drain coupled to receive a power supply signal at voltage $V_{dd}$ and a gate coupled to receive a precharge signal. The bitline precharge circuit further comprises a second n-type transistor with a drain and gate coupled to the source of the first n-type transistor wherein the source of the second n-type transistor is coupled to the first node.

The column select circuit comprises a third n-type transistor with a drain coupled to a sense amplifier input node and a gate coupled to receive a column select signal. The column select circuit further comprises a fourth n-type transistor with a drain and gate coupled to the source of the third n-type transistor wherein the source of the second n-type transistor is coupled to the first node. The sense amplifier precharge circuit comprises a p-type transistor with a source coupled to receive the power supply signal at voltage $V_{dd}$, a gate coupled to receive the inverse of the precharge control signal, and a drain coupled to the sense amplifier input node. The first, second, third and fourth n-type transistors have an identical threshold voltage $V_{tn}$.

BRIEF DESCRIPTION OF THE DRAWINGS

Other objects and advantages of the invention will become apparent upon reading the following detailed description and upon reference to the accompanying drawings in which:

FIG. 1 is a circuit diagram of a prior art sensing architecture for a digital memory.

FIG. 2 is a circuit diagram of an embodiment of the sensing architecture according to the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

FIG. 2 is a transistor level description of a sensing architecture according to the present invention. As shown, an SRAM memory 30 comprises a plurality of memory cells 32 arranged in a row by column format. It will be appreciated that the present invention may be used in other types of memories other than SRAM's. Each of a plurality of bit lines 34 corresponds to one of the columns. Each of the plurality of read bit lines 34 is coupled to a corresponding one of a plurality of pre-charge circuits 36, each of which comprises an n-type precharge transistor 38, with a threshold voltage $V_{tn}$, coupled between a power supply at voltage $V_{dd}$ and a diode 40, preferably comprising an n-type transistor, with the same threshold voltage $V_{tn}$ as the precharge transistor 38, such that the diode 40 causes a voltage drop of $V_{tn}$. The output of diode 40 is coupled to the bitline 34a at node 42. (The following describes circuitry associated with one of the plurality of bitlines 34; the circuitry for the other bitlines that are part of the plurality of bitlines 34 is preferably identical.)

The pre-charge transistor 38 receives a precharge signal at its gate. When the precharge signal goes high, the pre-charge transistor 38 is turned on and the voltage at the node 42 is $V_{dd}-2V_{tn}$. FIG. 2 shows a single step down transistor but any number of step down transistors may be used to obtain any desired multiple of $V_{tn}$ to be subtracted from $V_{dd}$.

An n-type column select transistor 44, with the same threshold voltage $V_{tn}$ mentioned above, in series with the bit line 34a receives at its gate a column select signal. The drain of the column select transistor 44 is coupled to a sense amplifier input node 46. A diode 48 comprising an n-type transistor, with the threshold voltage $V_{tn}$ and whose source and gate are coupled together, is coupled in series with the column select transistor 44. To select a particular column (i.e. bitline), the column select signal goes high, turning on the column select transistor 44. Since the voltage level of the sense amplifier input node 46 is $V_{dd}$ (as will be described below), column select transistor 44 pulls up the source and gate of the transistor are pulled up to $V_{dd}-V_{tn}$. The diode 48 steps down this voltage by $V_{tn}$ such that the voltage at the node 42 is $V_{dd}-2V_{tn}$. Therefore, the pre-charge and read voltages at node 42 are equal, as is desired, since, during a read of data 0, bitline 43*a* does not get discharged.

A sense amplifier block 50 comprises an invertor 52 and a p-channel transistor 54 that together form a loop. The input of invertor 52 is coupled to the sense amplifier input node 46 and the output of invertor 52 is coupled to another invertor 56 such that the output at the invertor 56 is essentialy equal to the voltage at the sense amplifier node 46. A sense amplifier precharge circuit 58 comprises a p-channel transistor and an invertor 60 that together serve to precharge the sense amplifier input node 46 to $V_{dd}$. In particular, the invertor 60 receives the precharge signal at its input and thus provides a low output when the precharge signal goes high. The output of the invertor 60 is coupled to the gate of the p-channel transistor 58; when the output of the invertor 60 goes low, the p-channel 58 pulls up the sense amplifier input node 46 to $V_{dd}$.

Numerous variations and modifications will become apparent to those skilled in the art once the above disclosure is fully appreciated. It is intended that the following claims be interpreted to embrace all such variations and modifications.

What is claimed is:

1. A sensing architecture for a digital memory comprising a plurality of memory cells arranged in a plurality of rows and a plurality of columns:

a plurality of read bitlines, each of the plurality of read bitlines corresponding to one of the plurality of columns;

a bitline precharge circuit for establishing the precharge voltage at a first node on a first one of the plurality of bitlines, the bitline precharge circuit comprising:
  a first n-type transistor with a drain coupled to receive a power supply signal at voltage $V_{dd}$ and a gate coupled to receive a precharge signal;
  a second n-type transistor with a drain and gate coupled to the source of the first n-type transistor, the source of the second n-type transistor coupled to the first node;

a column select circuit comprising:
  a third n-type transistor with a drain coupled to a sense amplifier input node $V_{dd}$ and a gate coupled to receive a column select signal;
  a fourth n-type transistor with a drain and gate coupled to the source of the third n-type transistor, the source of the second n-type transistor coupled to the first node;

a sense amplifier precharge circuit comprising a p-type transistor with a source coupled to receive the power supply signal at voltage $V_{dd}$, a gate coupled to receive the inverse of the precharge control signal, and a drain coupled to the sense amplifier input node; wherein the first, second, third and fourth n-type transistors have an identical threshold voltage $V_{tn}$.

* * * * *